United States Patent
Nagano (10) Patent No.: US 9,160,918 B2
(45) Date of Patent: Oct. 13, 2015

(54) FOCUS CONTROL APPARATUS AND METHOD FOR PERFORMING FOCUS CONTROL BY PHASE DIFFERENCE DETECTION, AND IMAGE CAPTURING APPARATUS

(71) Applicant: CANON KABUSHIKI KAISHA, Tokyo (JP)

(72) Inventor: Akihiko Nagano, Ichihara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/054,261

(22) Filed: Oct. 15, 2013

(65) Prior Publication Data

US 2014/0139725 A1 May 22, 2014

(30) Foreign Application Priority Data

Nov. 21, 2012 (JP) .................................. 2012-255509

(51) Int. Cl.
  *H04N 5/202* (2006.01)
  *H04N 5/232* (2006.01)
  *H01L 27/146* (2006.01)
  *H04N 5/369* (2011.01)

(52) U.S. Cl.
  CPC ...... *H04N 5/23212* (2013.01); *H01L 27/14627* (2013.01); *H04N 5/3696* (2013.01)

(58) Field of Classification Search
  CPC . H04N 5/37457; H04N 5/23212; G03B 13/36
  USPC .......................................... 348/254, 273, 294
  See application file for complete search history.

(56) References Cited

U.S. PATENT DOCUMENTS

2004/0228508 A1* 11/2004 Shigeta .......................... 382/124
2011/0096211 A1* 4/2011 Oikawa et al. ................ 348/273
2011/0096212 A1* 4/2011 Oikawa .......................... 348/273

FOREIGN PATENT DOCUMENTS

| CN | 102203656 A | 9/2011 |
| JP | 62-037364 A | 8/1987 |
| JP | 63-018314 A | 1/1988 |
| JP | 04-211213 A | 8/1992 |
| JP | 2001-124984 A | 5/2001 |

OTHER PUBLICATIONS

The above foreign patent documents were cited in a Jul. 29, 2015 Chinese Office Action, with an English Translation, that issued in Chinese Patent Application No. 201310594719.8.

* cited by examiner

*Primary Examiner* — Usman Khan (74) *Attorney, Agent, or Firm* — Cowan, Liebowitz & Latman, P.C.

(57) ABSTRACT

A focus detection apparatus comprises: an image sensor configured to receive a plurality of beams having passed through different exit pupil regions of an imaging optical system and output a pair of image signals corresponding to the different exit pupil regions; a calculation unit configured to obtain, from the pair of image signals, a spatial frequency at which a phase difference between a pair of images is minimized, and obtain an image shift amount between the pair of image signals from the spatial frequency; and a focus control unit configured to perform focus control by a phase difference detection method based on the image shift amount obtained by the calculation unit.

7 Claims, 11 Drawing Sheets

FOCUS CONTROL APPARATUS AND METHOD FOR PERFORMING FOCUS CONTROL BY PHASE DIFFERENCE DETECTION, AND IMAGE CAPTURING APPARATUS

BACKGROUND OF THE INVENTION

1. Field of the Invention

The present invention relates to a focus detection apparatus and method for detecting the focus state of an imaging lens by using an image generated from beams having passed through different pupil regions of the imaging lens, and an image capturing apparatus.

2. Description of the Related Art

Conventionally, focus detection methods used in digital cameras serving as image capturing apparatuses include a contrast detection method popularly used in video cameras and compact cameras, and a phase difference detection method popularly used in single-lens reflex cameras. In general, a phase difference focus detection method used in single-lens reflex cameras is used to capture a still image because detection is performed by splitting a beam into those for a viewfinder optical system and focus detection optical system by a half mirror or the like inserted in the light path. The focus detection optical system is normally formed from two or more reimaging lenses which receive beams having passed through different pupil regions of the imaging lens, a stop, and an image sensor.

In the phase difference focus detection method, the focus state of the imaging lens is calculated based on an image shift amount between two focus detection images generated from beams having passed through different pupil regions of the imaging lens. The image shift amount between two focus detection images is calculated by performing correlation calculation for the two focus detection images. This calculation method is disclosed in, for example, Japanese Patent Laid-Open No. 63-18314.

When a moving image is viewed or recorded in a camera which captures an image by an image sensor, a contrast detection focus control method is used generally. In the contrast detection focus control method, focus control is performed by extracting the high-frequency component of an image sensed by the image sensor while moving the focus lens of the imaging lens along the optical path, and detecting a lens position where the contrast peaks. However, the contrast detection focus control method cannot perform focus control quickly because the contrast levels of images are compared while moving the focus lens. In recent years, even a single-lens reflex camera can capture a moving image, and it is desired to perform focus control quickly even during moving image capturing.

To meet this demand, the present applicant discloses, in Japanese Patent Laid-Open No. 2001-124984, an image capturing apparatus which can perform phase difference focus detection by arranging two photoelectric converters for one on-chip microlens forming part of a CMOS image sensor. In the image sensor disclosed in Japanese Patent Laid-Open No. 2001-124984, the on-chip microlens is configured so that the pupil of an imaging lens and two photoelectric converters have a conjugated relation. As a result, beams having passed through different pupil regions of the imaging lens are incident on the respective photoelectric converters. By using images obtained by the respective photoelectric converters, known phase difference focus detection can be performed.

Japanese Patent Publication No. 62-37364 discloses a focus detection method of, when detecting the focus state of an imaging lens by using a focus detection image generated from beams having passed through different pupil regions of the imaging lens, obtaining the focus state by detecting the phase of a predetermined spatial frequency of the focus detection image.

However, in the method disclosed in Japanese Patent Publication No. 62-37364, when the focus state is obtained by using the phase of a predetermined spatial frequency of a detected focus detection image, no high-accuracy focus detection can be performed unless the object contains the predetermined spatial frequency component used for detection.

SUMMARY OF THE INVENTION

The present invention has been made in consideration of the above situation, and enables high-accuracy focus detection independent of the spatial frequency of an object.

According to the present invention, provided is a focus detection apparatus comprising: an image sensor configured to receive a plurality of beams having passed through different exit pupil regions of an imaging optical system and output a pair of image signals corresponding to the different exit pupil regions; a calculation unit configured to obtain, from the pair of image signals, a spatial frequency at which a phase difference between a pair of images is minimized, and obtain an image shift amount between the pair of image signals from the spatial frequency; and a focus control unit configured to perform focus control by a phase difference detection method based on the image shift amount obtained by the calculation unit.

Further, according to the present invention, provided is an image capturing apparatus comprising the focus detection apparatus defined as above.

Furthermore, according to the present invention, provided is a focus detection method comprising: an image sensing step of receiving a plurality of beams having passed through different exit pupil regions of an imaging optical system and outputting a pair of image signals corresponding to the different exit pupil regions; a calculation step of obtaining, from the pair of image signals, a spatial frequency at which a phase difference between a pair of images is minimized, and obtaining an image shift amount between the pair of image signals from the spatial frequency; and a focus control step of performing focus control by a phase difference detection method based on the image shift amount obtained in the calculation step.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Exemplary embodiments of the present invention will be described in detail in accordance with the accompanying drawings. The dimensions, shapes and relative positions of the constituent parts shown in the embodiments should be changed as convenient depending on various conditions and on the structure of the apparatus adapted to the invention, and the invention is not limited to the embodiments described herein.

Figure 1A:
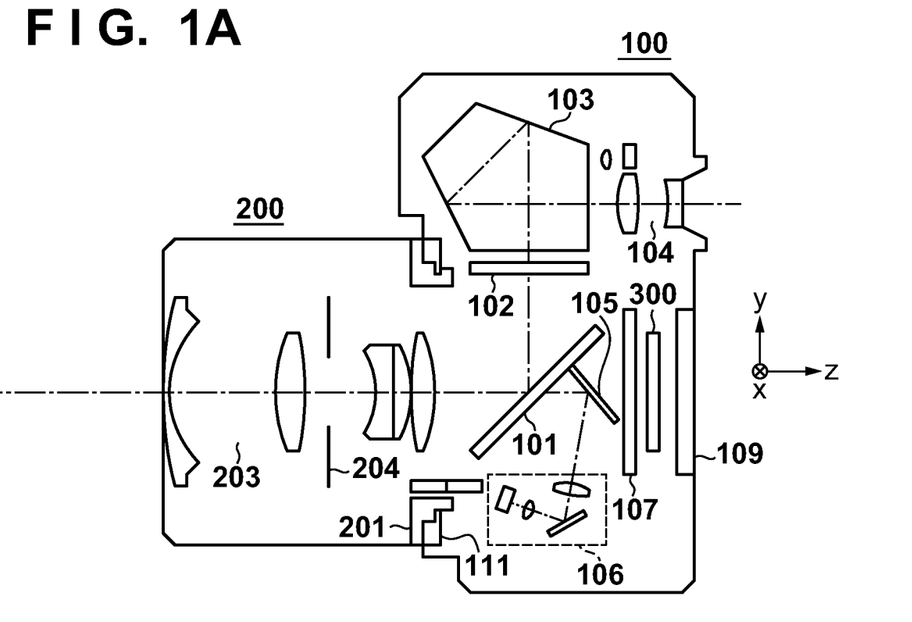
FIGS. 1A and 1B are views showing the schematic arrangement of an image capturing apparatus according to an embodiment of the present invention.
Figure 1B:
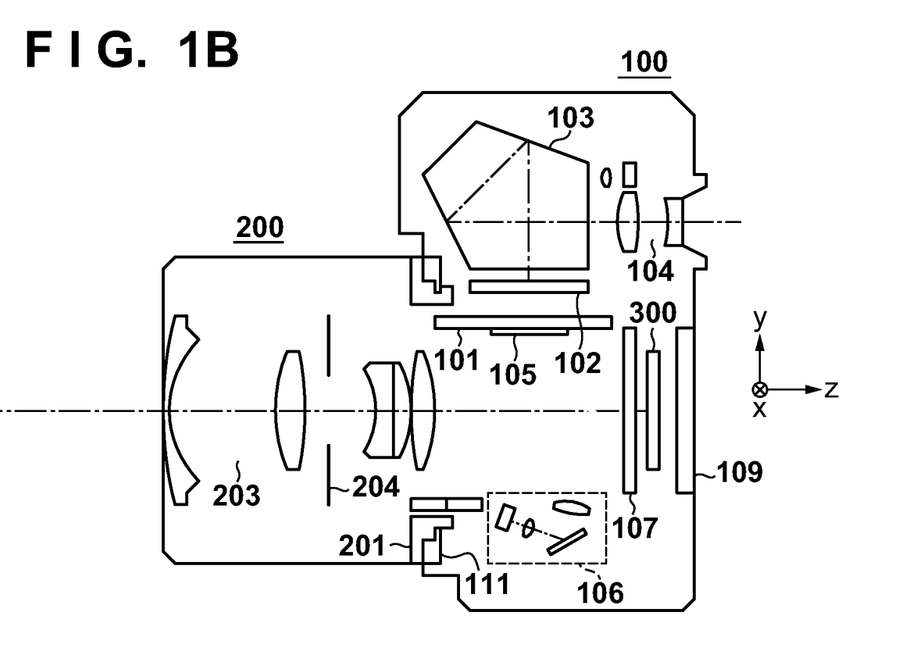

FIGS. 1A and 1B are views showing the schematic arrangement of a digital camera serving as an image capturing apparatus according to an embodiment of the present invention. FIG. 1A shows a viewing state using an optical viewfinder. FIG. 1B shows a state in which an object is captured. The digital camera in the embodiment is configured as a single-lens reflex digital camera in which an imaging lens 200 is detachable from a camera body 100 via a camera-side mount 111 and lens-side mount 201.

The imaging lens 200 is formed from a lens group 203 and stop 204. In the viewing state as shown in FIG. 1A, object light having passed through the imaging lens 200 is reflected by a quick return mirror 101 of the camera body 100 and converges to the vicinity of a focusing plate 102. The object light which has been diffused and has passed through the focusing plate 102 is guided to the eye of the user (not shown) via a roof pentaprism 103 and eyepiece lens 104.

Note that the quick return mirror 101 is a half mirror. Part of object light having passed through the quick return mirror 101 is reflected by a sub-mirror 105, and guided to a focus detection apparatus 106. The focus detection apparatus 106 includes two or more reimaging lenses which receive beams having passed through different pupil regions of the imaging lens 200, and a line sensor. The reduction magnification of the reimaging lens is 1/10, and the reimaging lens images object light on the line sensor. The focus detection apparatus 106 outputs a pair of images generated from beams having passed through different pupil regions of the imaging lens 200, and detects the focus state of the imaging lens 200 based on the pair of images. Note that the focus detection apparatus 106 is used to capture a still image.

An image sensor 300 is disposed on the planned image forming plane of the imaging lens 200. The image sensor 300 is formed by two-dimensionally arranging a plurality of pixels. One pixel is divided into a plurality of photoelectric converters, and the respective photoelectric converters receive beams having passed through different pupil regions of the imaging lens 200.

The digital camera in the embodiment can capture a moving image. In moving image capturing, the quick return mirror 101 and sub-mirror 105 are retracted from the light path, and a shutter 107 is set to an open state, as shown in FIG. 1B. At this time, an image captured by the image sensor 300 can be viewed on a liquid crystal display element 109.

Figure 2A:
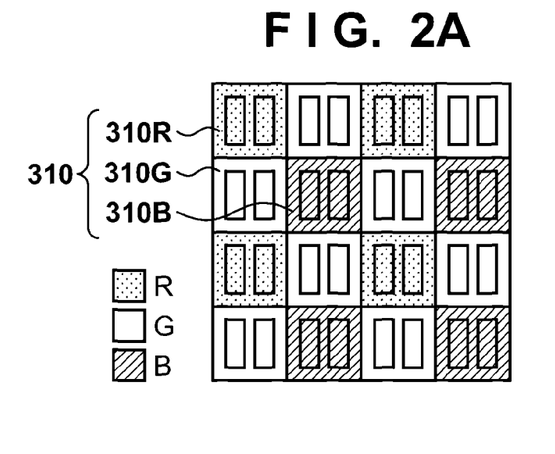
FIGS. 2A to 2C are views for explaining an example of the arrangement of an image sensor according to the embodiment.
Figure 2B:
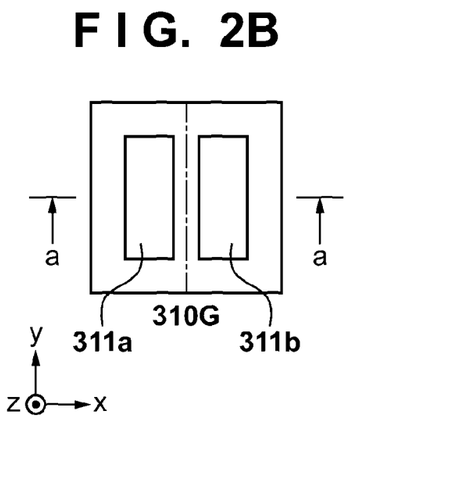

Next, an example of the arrangement of the image sensor 300 will be explained with reference to FIGS. 2A to 2C. FIG. 2A is a view showing a pixel array when a primary color mosaic filter having a Bayer array is formed on the chip of the image sensor 300. FIG. 2A shows a 4×4 pixel range. Each pixel group 310 is formed from 2×2 pixels. Pixels 310G having the green (G) spectral sensitivity are arranged in two diagonal pixels, and a pixel 310R having the red (R) spectral sensitivity and a pixel 310B having the blue (B) spectral sensitivity are arranged in two remaining pixels. FIG. 2B is an enlarged view showing the pixel 310G including a plurality of photoelectric converters (to be referred to as "sub-pixels $311a$ and $311b$" hereinafter) for pupil division. Similarly, each of the pixels 310R and 310B includes two sub-pixels $311a$ and $311b$. Each pixel can output image signals obtained by independently receiving beams by the sub-pixels $311a$ and $311b$. The independently obtained image signals can be used for focus detection and for image sensing by adding them for each pixel. The pixel groups 310 having this arrangement are repetitively arrayed. Note that all the pixels include the sub-pixels $311a$ and $311b$ in the arrangement shown in FIGS. 2A to 2C, but pixels having sub-pixels may be discretely arranged in the image sensor 300. In the discrete arrangement, the image sensor 300 may be covered with a transparent filter, instead of the color filter.

Figure 2C:
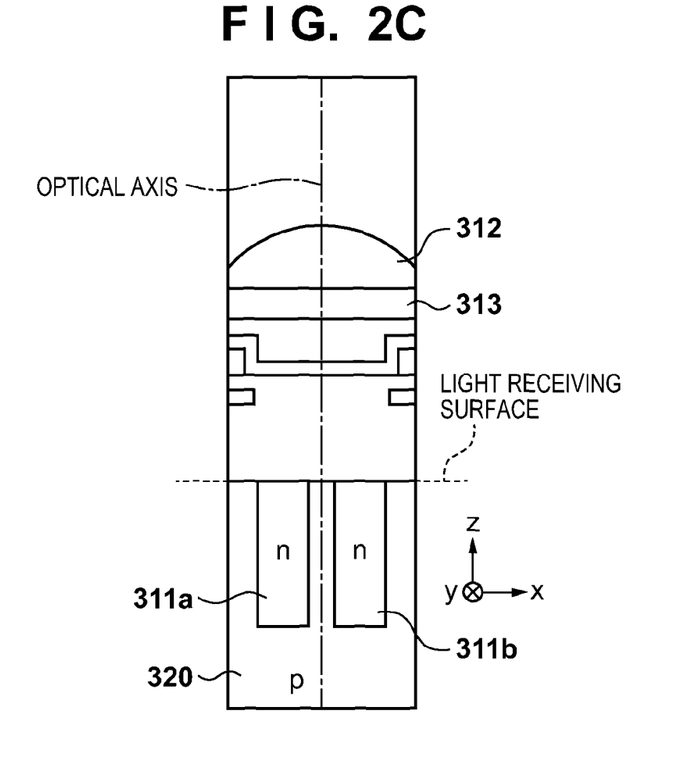

FIG. 2C is a sectional view taken along a line a-a in FIG. 2B. In FIG. 2C, reference numeral 320 denotes a p-type layer; 312, an on-chip microlens; and 313, a color filter which mainly transmits light of the G band. Two n-type layers are formed to be contained in the p-type layer 320, thereby forming the sub-pixels $311a$ and $311b$. The sub-pixels $311a$ and $311b$ are decentered in the +x and −x directions with respect to the optical axis, respectively. With this arrangement, pupil division can be performed by using one microlens 312. Note that the pixels 310R and 310B have the same arrangement except that the band of light passing through the color filter 313 is mainly the R and B bands, respectively.

Figure 3:
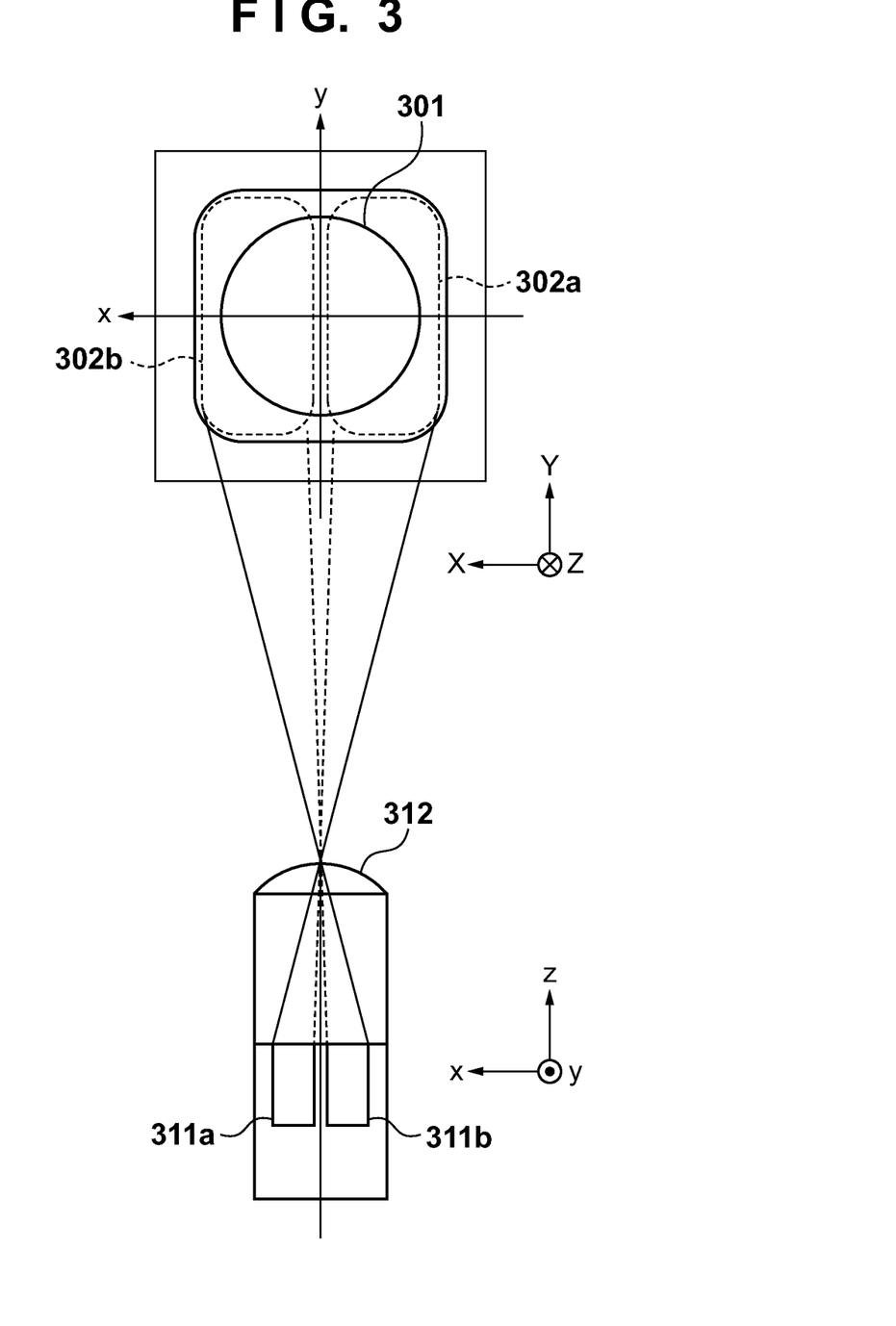
FIG. 3 is a view for explaining a concept of pupil division according to the embodiment.

Next, a concept of pupil division will be explained with reference to FIG. 3 by exemplifying the pixel 310G serving as one pixel included in the image sensor 300 shown in FIG. 2B. The size of an exit pupil 301 changes depending on the size of the aperture of the stop, the size of a lens frame holding a lens, and the like. Reference numeral $302a$ denotes a shape obtained by projecting the sub-pixel $311a$ to the exit pupil position of the imaging lens 200; and $302b$, a shape obtained by projecting the sub-pixel $311b$ to the exit pupil position of the imaging lens 200.

An image signal acquired from the sub-pixels $311a$ regularly arrayed in the x direction is defined as an A image (one of image signals obtained from a pair of beams having passed through different exit pupil regions of the imaging optical system). Similarly, an image signal acquired from the sub-pixels $311b$ regularly arrayed in the x direction is defined as a B image (the other one of image signals obtained from a pair of beams having passed through different exit pupil regions of the imaging optical system). The focus position of the imaging optical system can be calculated by calculating a defocus amount (control amount) by using correlation calculation from the relative image shift amount between the A and B images. Based on the thus-obtained focus position, the focus shift amount of the imaging optical system is adjusted. The arrangement which copes with an object having a luminance distribution in the x direction has been explained. However, an arrangement which copes with even an object having a luminance distribution in the y direction can also be taken by expanding the same arrangement in the y direction.

A case in which two photoelectric converters are arranged in each pixel has been described. However, it is also possible to arrange three or more photoelectric converters, and obtain a pair of images by, for example, adding or thinning out obtained image signals.

Figure 4:
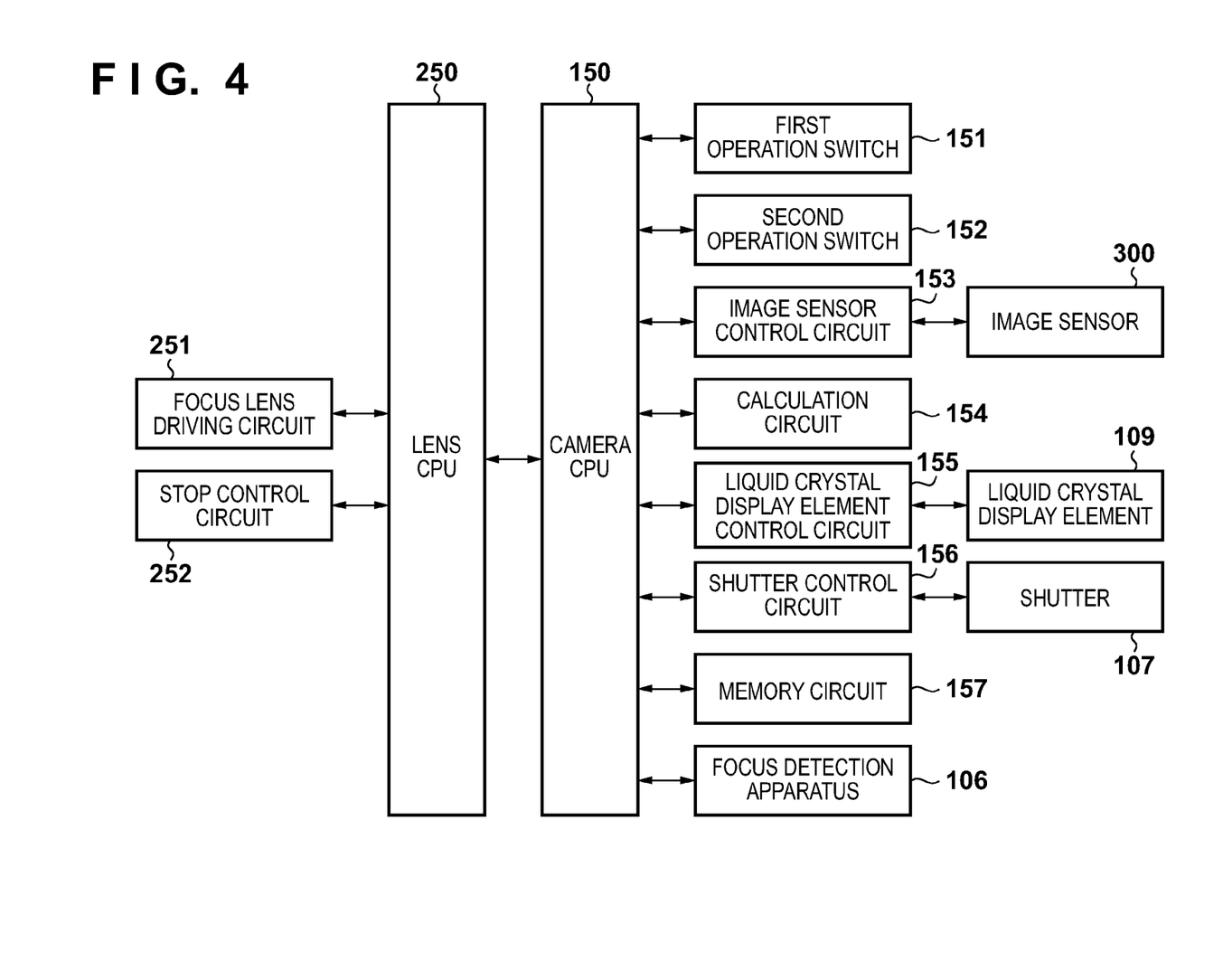
FIG. 4 is a block diagram showing the schematic arrangement of the image capturing apparatus according to the embodiment.
Figure 5:
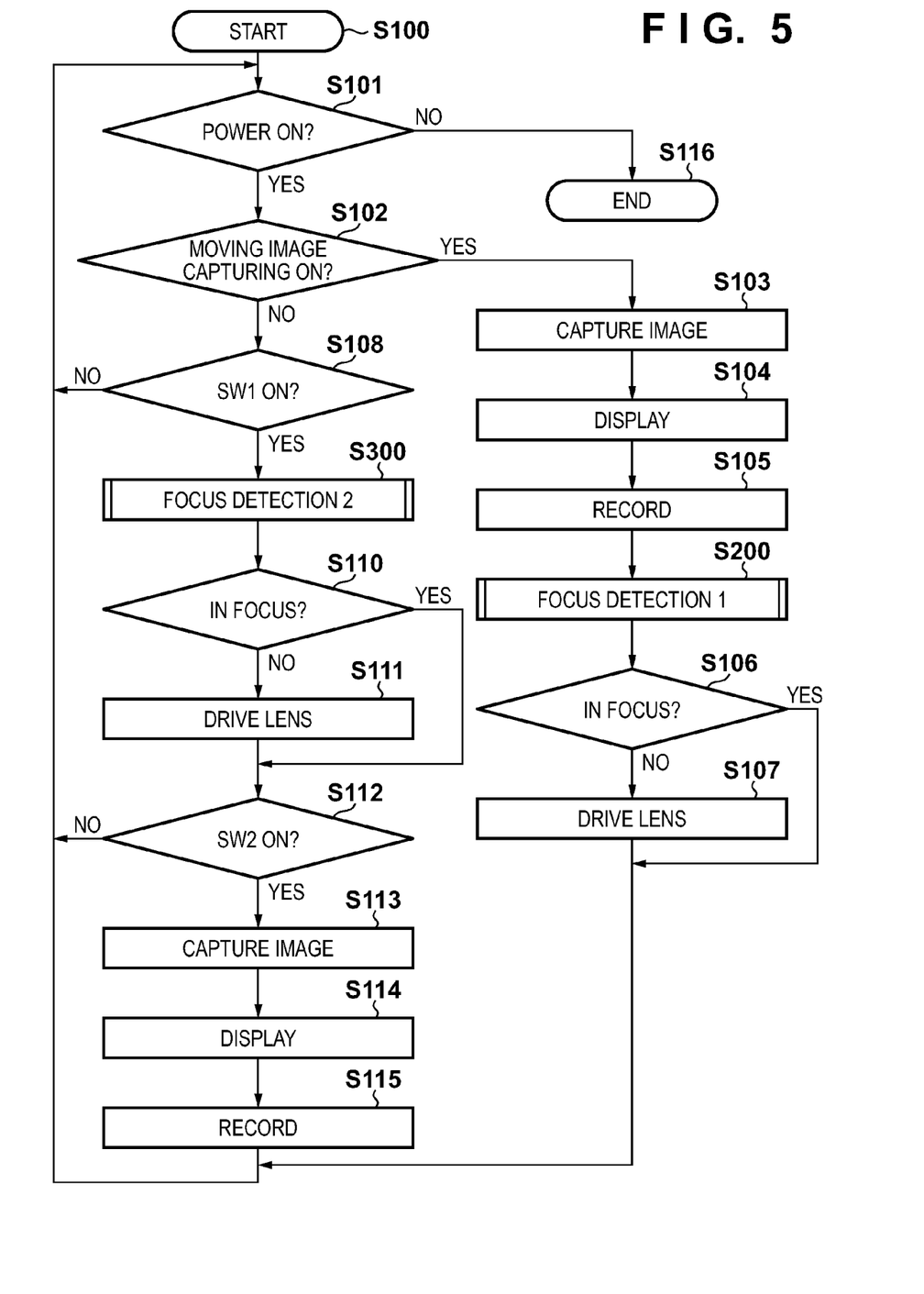
FIG. 5 is a flowchart showing image capturing processing according to the embodiment.

Next, an image capturing operation in the embodiment will be explained with reference to the block diagram of FIG. 4 showing the schematic arrangement of the digital camera, and the flowchart of FIG. 5 showing image capturing processing.

In the flowchart of FIG. 5, if the power supply (not shown) of the camera body 100 is turned on (YES in step S101), a camera CPU 150 which controls the camera body 100 checks the state of a first operation switch 151 used to designate moving image capturing (step S102). If the user turns on the first operation switch 151 and designates moving image capturing (YES in step S102), the camera CPU 150 retracts the quick return mirror 101 and sub-mirror 105 from the light path, as shown in FIG. 1B. Further, the camera CPU 150 opens the shutter 107 via a shutter control circuit 156. The camera CPU 150 causes a stop control circuit 252 to control the stop 204 via a lens CPU 250, and adjusts the stop 204 to obtain an appropriate exposure.

After the preparations for image capturing are completed, the camera CPU 150 causes the image sensor 300 to capture an object via an image sensor control circuit 153 (step S103). A calculation circuit 154 processes the image captured by the image sensor 300 into an image for display, which is displayed on the liquid crystal display element 109 via a liquid crystal display element control circuit 155 (step S104). Further, an image processed into one for recording by the calculation circuit 154 is recorded in a memory circuit 157 (step S105). Note that the image recording destination may be a detachable recording medium.

While an image is recorded, the camera CPU 150 and calculation circuit 154 detect the focus state of the imaging lens 200 based on an image captured by the image sensor 300 (step S200). The processing (focus detection 1) in step S200 will be described later with reference to FIG. 6.

After the focus state of the imaging lens 200 is detected, in-focus control is performed based on the detected focus state. First, the camera CPU 150 performs in-focus determination (step S106). If the imaging lens 200 is out of focus (NO in step S106), the camera CPU 150 transmits a calculated defocus amount of the imaging lens 200 to the lens CPU 250. The lens CPU 250 converts the defocus amount of the imaging lens 200 into a step driving amount of the focus lens, and then transmits a signal to a focus lens driving circuit 251 to drive the focus lens (step S107).

Subsequently, the camera CPU 150 checks the state of the first operation switch 151 used to designate moving image capturing. If the first operation switch 151 is ON (YES in step S102), the process advances to step S103 to continue the above-described moving image capturing.

If the first operation switch 151 used to designate moving image capturing is OFF (NO in step S102), the camera CPU 150 checks the state of a second operation switch 152 used to designate still image capturing (step S108). If a preceding operation (SW1) of still image capturing has not been executed with the second operation switch 152 (NO in step S108), the process returns to step S101.

If the preceding operation (SW1 ON) for still image capturing has been executed with the second operation switch 152, the focus state of the imaging lens 200 is detected (step S300). At this time, the quick return mirror 101 and sub-mirror 105 are in the state shown in FIG. 1A in which they are inserted in the light path. The camera CPU 150 and calculation circuit 154 perform calculation for focus detection based on an image output from the focus detection apparatus 106. The processing (focus detection 2) in step S300 will be described later with reference to FIG. 7.

After the focus state of the imaging lens 200 is detected, in-focus control is performed based on the detected focus state. First, if it is determined from a calculated defocus amount of the imaging lens 200 that the imaging lens 200 is in the in-focus state (YES in step S110), the camera CPU 150 checks the state of the second operation switch 152 used to designate still image capturing (step S112). If the imaging lens 200 is out of focus (NO in step S110), the camera CPU 150 transmits the detected defocus amount of the imaging lens 200 to the lens CPU 250. The lens CPU 250 converts the defocus amount of the imaging lens 200 into a step driving amount of the focus lens, and then transmits a signal to the focus lens driving circuit 251 to drive the focus lens (step S111). Further, the camera CPU 150 checks the state of the second operation switch 152 used to designate still image capturing (step S112).

If a subsequent operation (SW2) of still image capturing has not been executed with the second operation switch 152 (NO in step S112), the process returns to step S101 and waits. If the subsequent operation (SW2 ON) for still image capturing has been executed with the second operation switch 152 (YES in step S112), the camera CPU 150 retracts the quick return mirror 101 and sub-mirror 105 from the light path, as shown in FIG. 1B. Further, the camera CPU 150 opens the shutter 107 via the shutter control circuit 156. The camera CPU 150 causes the stop control circuit 252 to control the stop 204 via the lens CPU 250, and adjusts the stop 204 to obtain an appropriate exposure.

After the preparations for still image capturing are completed, the camera CPU 150 causes the image sensor 300 to capture an object via the image sensor control circuit 153 (step S113). The calculation circuit 154 processes the image captured by the image sensor 300 into an image for display, which is displayed on the liquid crystal display element 109 via the liquid crystal display element control circuit 155 (step S114). Further, an image processed into one for recording by the calculation circuit 154 is recorded in the memory circuit 157 (step S115). Note that the image recording destination may be a detachable recording medium.

After the end of recording the image (step S115), the process returns to step S101, and the camera CPU 150 waits. If the power supply (not shown) of the camera body 100 is OFF (NO in step S101), a series of camera image capturing operations ends (step S116).

Figure 7:
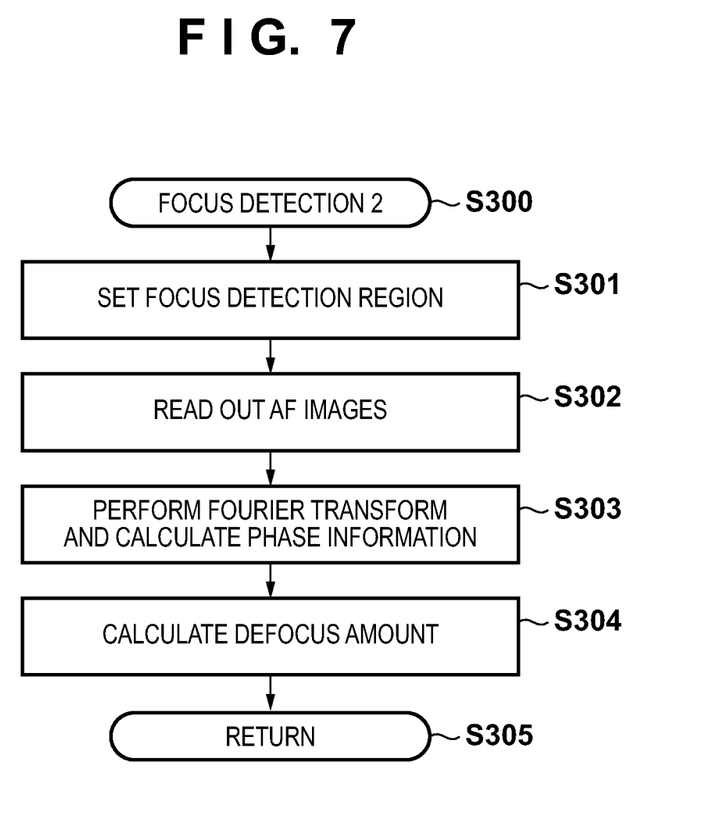
FIG. 7 is a flowchart showing processing of focus detection 2 according to the embodiment.

Prior to the processing of focus detection 1 performed in step S200 in moving image capturing, the processing of focus detection 2 performed in step S300 in still image capturing will be explained with reference to the flowchart of FIG. 7. First, the camera CPU 150 checks a focus detection region set by the user (step S301), and reads out, from the focus detection apparatus 106, a pair of images for focus detection (to be referred to as "focus detection images" hereinafter) corresponding to the focus detection region (step S302). The calculation circuit 154 performs fast Fourier transform for the pair of focus detection images, and calculates pieces of phase information for respective spatial frequencies contained in the pair of focus detection images (step S303).

Figure 8A:
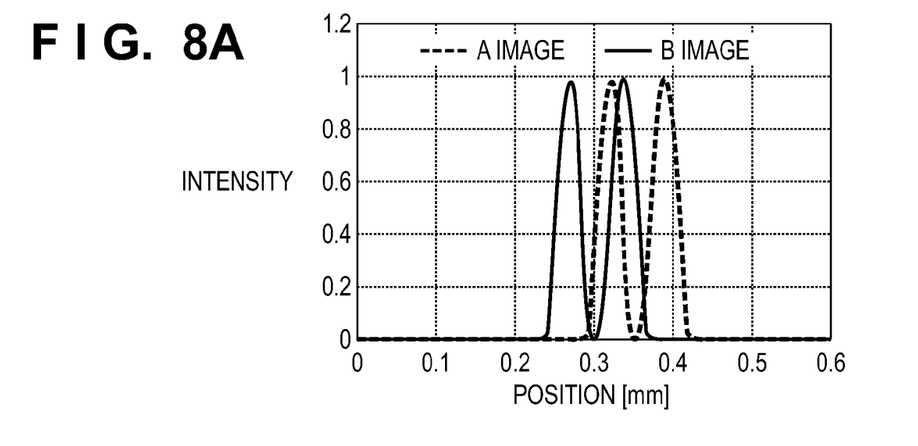
FIGS. 8A to 8C are graphs for explaining a phase information calculation processing method according to the embodiment.
Figure 8B:
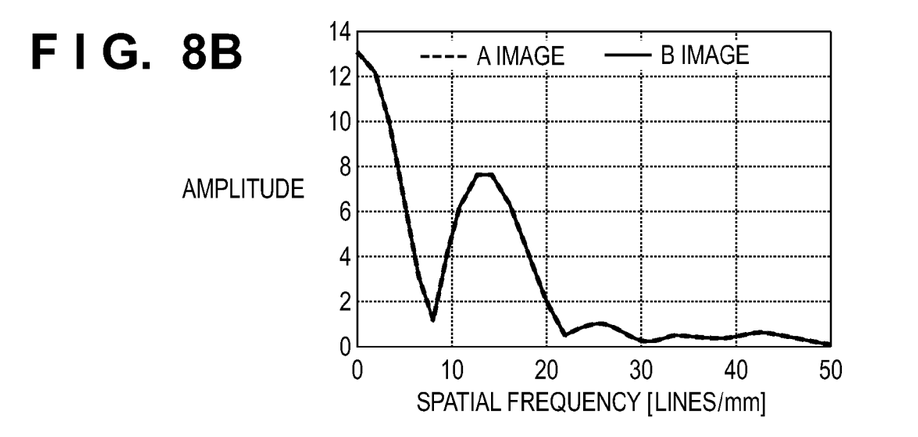
Figure 8C:
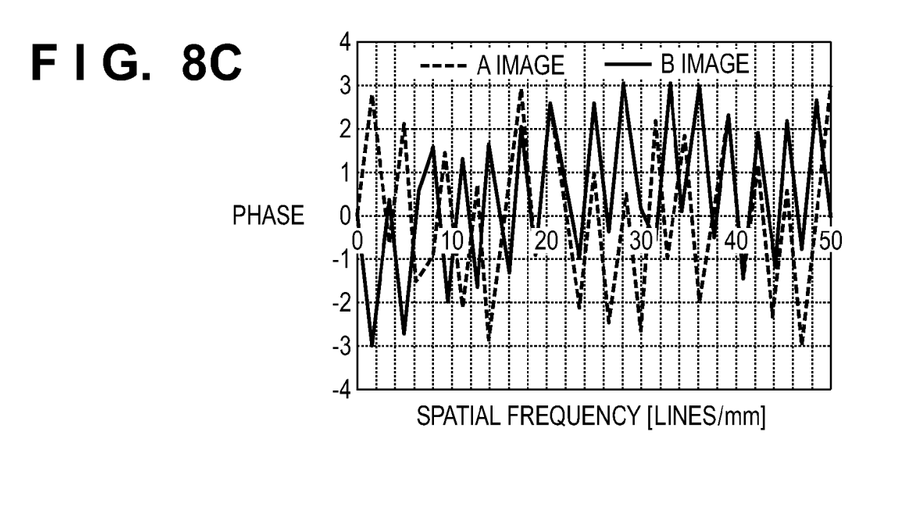

The calculation processing method to be executed in step S303 will be described with reference to FIGS. 8A to 8C. FIG. 8A shows a pair of focus detection images (A and B images) obtained by the focus detection apparatus 106 when the object is two white lines arranged side by side. In FIG. 8A, the abscissa represents a position on the line sensor forming the focus detection apparatus 106. The image shift amount between the two focus detection images is 0.05 mm. FIG. 8B shows the spatial frequency characteristics of the amplitudes of the two focus detection images obtained after fast Fourier transform. FIG. 8C shows the spatial frequency characteristics of the phases of the two focus detection images obtained after fast Fourier transform. Since the waveform shapes of the two focus detection images almost coincide with each other, as shown in FIG. 8A, the spatial frequency characteristics of the amplitudes of the two focus detection images shown in FIG. 8B also almost coincide with each other. As is apparent from FIG. 8B, there is a spatial frequency having almost no amplitude.

Figure 9A:
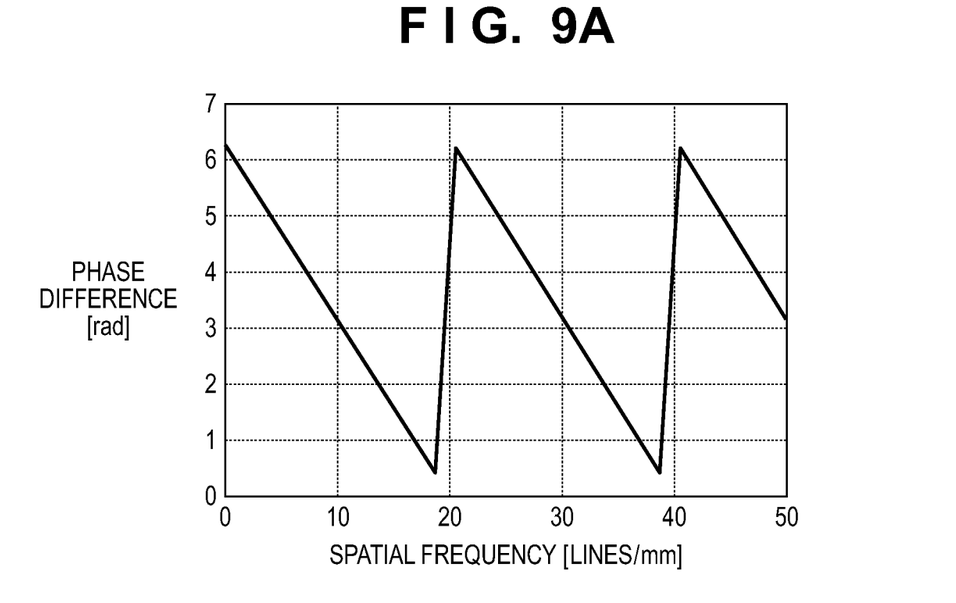
FIGS. 9A and 9B are graphs for explaining the phase information calculation processing method according to the embodiment.

FIG. 9A shows the phase difference between the two focus detection images that is calculated by converting the obtained phases of the two focus detection images shown in FIG. 8C into 0 to $2\pi$. At this time, a spatial frequency at which the phase difference is minimized (or comes closest to $2\pi$) represents the image shift amount between the two focus detection images. A spatial frequency component at which the phase difference between the two focus detection images becomes 0 or $2\pi$ is contained in the two respective focus detection images, and means that their phases coincide with each other.

Figure 9B:
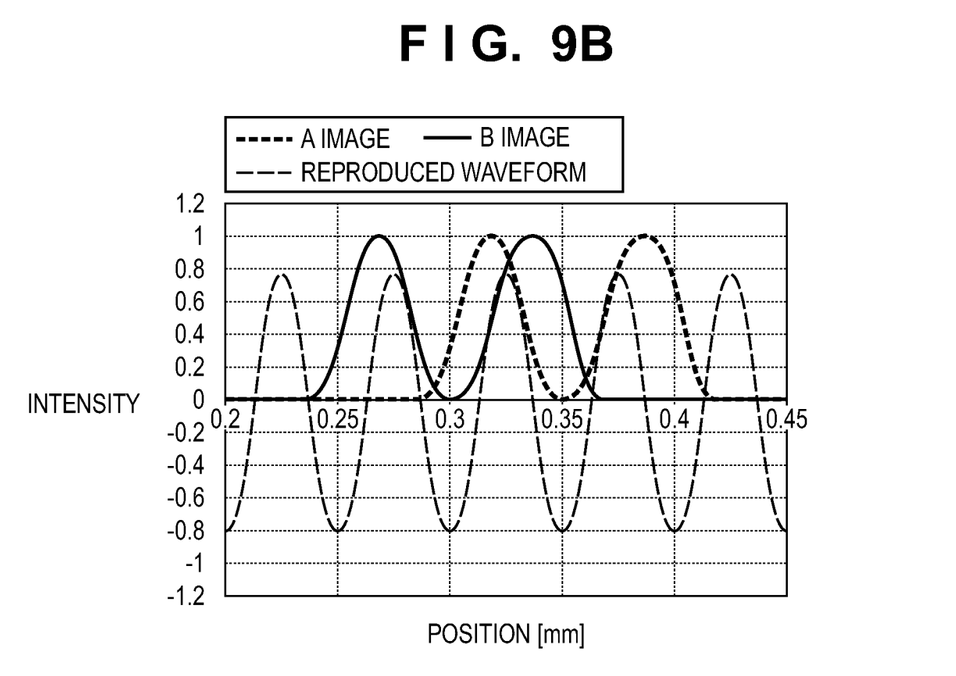

The fact that the spatial frequency at which the phase difference between the two focus detection images is minimized (or comes closest to $2\pi$) represents the image shift amount between the two focus detection images will be explained with reference to FIG. 9B. FIG. 9B shows the two focus detection images (A and B images) on the line sensor, and a spatial frequency component (dotted line in FIG. 9B) at which the phase difference is minimized (or comes closest to $2\pi$). In FIG. 9B, the spatial frequency component at which the phase difference is minimized (or comes closest to $2\pi$) is indicated by a dotted line as a "reproduced waveform". Reproduced waveforms exist for the two respective focus detection images. However, these reproduced waveforms indicate spatial frequency components at which the phase difference between spatial frequencies contained in the two focus detection images is 0 or almost $2\pi$. Thus, the reproduced waveforms for the two focus detection images almost coincide with each other. FIG. 9B reveals that one cycle of the reproduced waveform shown in FIG. 9B coincides with the image shift amount between the two focus detection images.

As described above, the CPU 150 obtains a spatial frequency (=20 lines/mm) at which the phase difference between the two focus detection images is minimized (or comes closest to $2\pi$). Then, the CPU 150 sets the reciprocal of the spatial frequency as the image shift amount (=1/20mm) between the two focus detection images.

Further, the CPU 150 calculates the defocus amount of the imaging lens 200 based on the image shift amount obtained from a base line length intrinsic to the focus detection apparatus 106 and the spatial frequency characteristics of the phases of the focus detection images (step S304). After the defocus amount is calculated, the process returns to the main routine (step S305).

Figure 6:
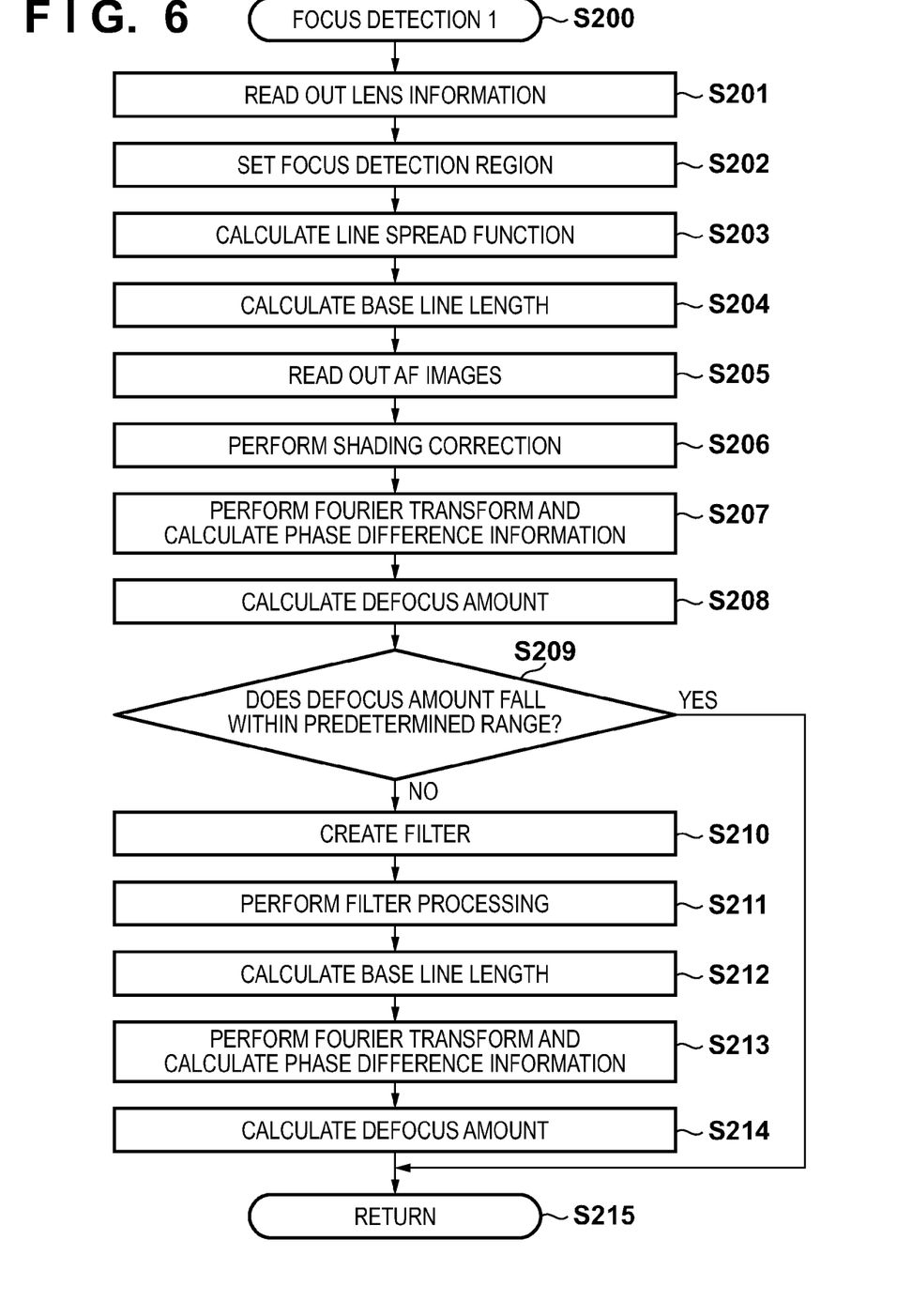
FIG. 6 is a flowchart showing processing of focus detection 1 according to the embodiment.

Next, the processing of focus detection 1 performed in step S200 in moving image capturing will be explained with reference to the flowchart of FIG. 6. First, the camera CPU 150 reads out lens information via the lens CPU 250 in order to know the vignetting state of a beam by the imaging lens 200 (step S201). Then, the CPU 150 checks a focus detection region set by the user (step S202). Further, the CPU 150 reads out the light receiving distribution of the image sensor 300 that is stored in the memory circuit 157. The CPU 150 calculates vignetting in the set focus detection region from the lens information of the imaging lens 200. After that, the CPU 150 calculates a line spread function from the light receiving distribution of the image sensor 300 that has been read out from the memory circuit 157, and the vignetting by the imaging lens 200 (step S203).

When the focus state of the imaging lens 200 is detected using two images generated from beams having passed through different pupil regions of the imaging lens 200, the focus detection accuracy is determined by the barycentric positions of the beams passing through pupil regions. The interval between the barycenters of beams passing through different pupil regions of the imaging lens 200 will be called a base line length. The base line length is calculated from the interval between barycenters in the line spread function serving as the projection of the light receiving distribution of focus detection images passing through different pupil regions of the imaging lens 200 (step S204). After the base line length is calculated, the CPU 150 reads out a pair of focus detection images from the memory circuit 157 (step S205).

Then, the output offsets of the pair of focus detection images are corrected (so-called shading correction) based on the line spread function corresponding to each image height (step S206). Further, the calculation circuit 154 performs fast Fourier transform for the pair of focus detection images having undergone shading correction, and calculates phase information for the spatial frequency (step S207).

Figure 10A:
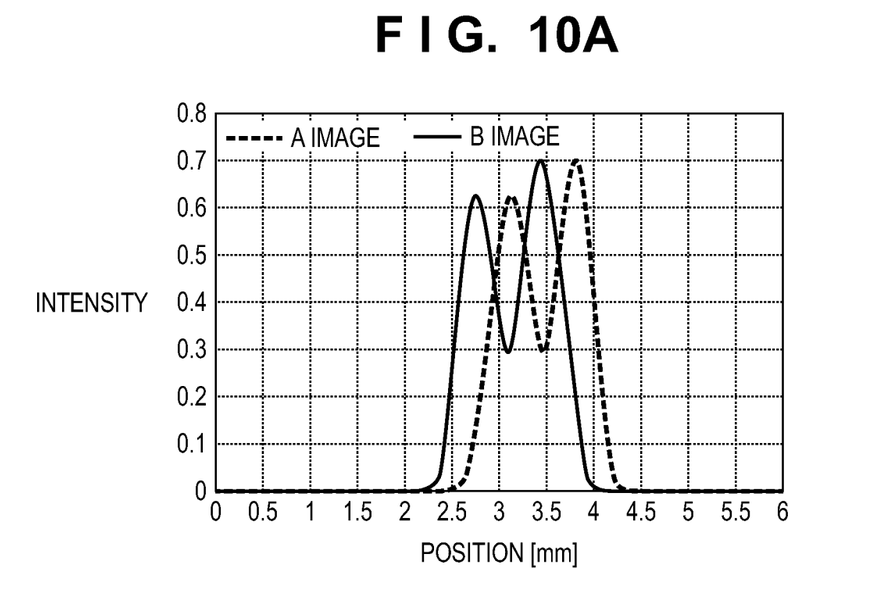
FIGS. 10A and 10B are graphs for explaining the phase information calculation processing method according to the embodiment.

The calculation processing method to be executed in step S207 will be explained with reference to FIGS. 10A and 10B. FIG. 10A shows two focus detection images (A and B images) obtained after shading correction when the object is two white lines arranged side by side. In FIG. 10A, the abscissa represents a position on the image sensor 300. The image shift amount between the two focus detection images is 0.5 mm. The two focus detection images are signals asymmetrical in the image shift direction due to the difference of vignetting by the imaging lens 200.

Figure 10B:
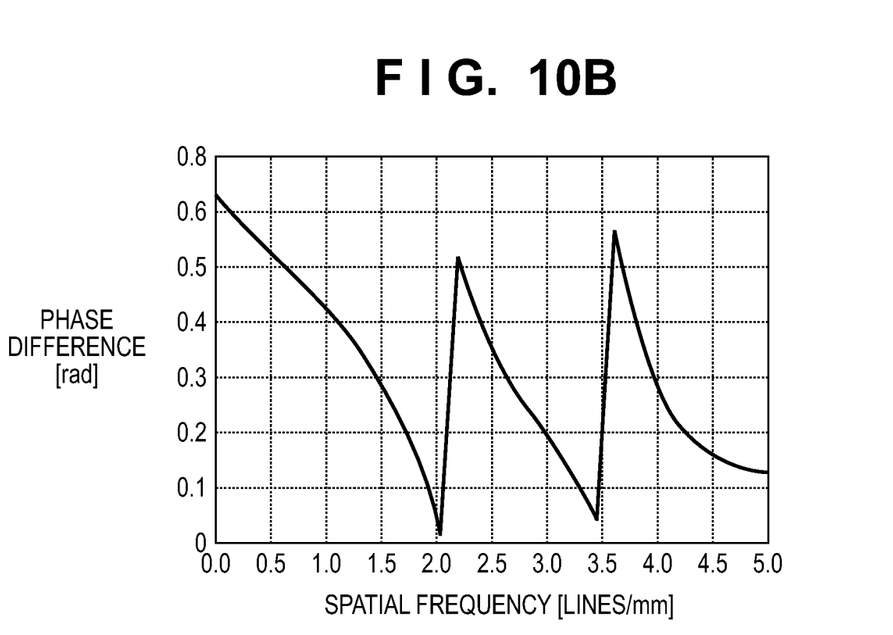

FIG. 10B shows the spatial frequency characteristic of the phase difference between the two focus detection images obtained after fast Fourier transform. The CPU 150 obtains a spatial frequency ($\approx 2$ lines/mm) at which the phase difference is minimized (or comes closest to $2\pi$). Then, the CPU 150 sets the reciprocal of the spatial frequency as the image shift amount (=1/2mm) between the two focus detection images. Further, the CPU 150 calculates a provisional defocus amount of the imaging lens 200 from the previously obtained base line length and the image shift amount (step S208).

The CPU 150 determines whether the calculated provisional defocus amount falls within a predetermined range (step S209). If the CPU 150 determines that the provisional defocus amount falls within the predetermined range (YES in step S209), the process returns to the main routine (step S215). When the provisional defocus amount falls within the predetermined range, no image correction processing is performed because the asymmetry between two images is not so lost when the defocus amount is small. Thus, the defocus amount can be obtained at satisfactory accuracy without image correction.

To the contrary, if the CPU 150 determines that the provisional defocus amount falls outside the predetermined range (NO in step S209), image correction processing is performed to improve the symmetry between the focus detection images in order to calculate the defocus amount at higher accuracy. To perform image correction processing for the focus detection images, the CPU 150 creates a filter (image correction filter) for performing image correction (step S210). The image correction filter is obtained based on the previously obtained line spread function and the calculated provisional defocus amount.

After the image correction filter is created (step S210), the calculation circuit 154 performs filter processing to eliminate the asymmetry between the focus detection images output from the image sensor 300 (step S211). The focus detection images having undergone the filter processing become almost close to the focus detection image waveforms shown in FIG. 8A. Since the filter processing is performed for the focus detection images, filter processing is also performed for the line spread function for calculating a base line length, and then the base line length is recalculated (step S212).

Further, the calculation circuit 154 performs fast Fourier transform for the corrected focus detection images, and recalculates pieces of phase information for the spatial frequencies (step S213). The CPU 150 obtains a spatial frequency at which the phase difference between the focus detection images after fast Fourier transform is minimized (or comes closest to $2\pi$), and sets it as the image shift amount between the two focus detection images. Further, the CPU 150 calculates the defocus amount of the imaging lens 200 from the corrected base line length obtained previously and the image shift amount (step S214). After the defocus amount is calculated, the process returns to the main routine (step S215).

Figure 11A:
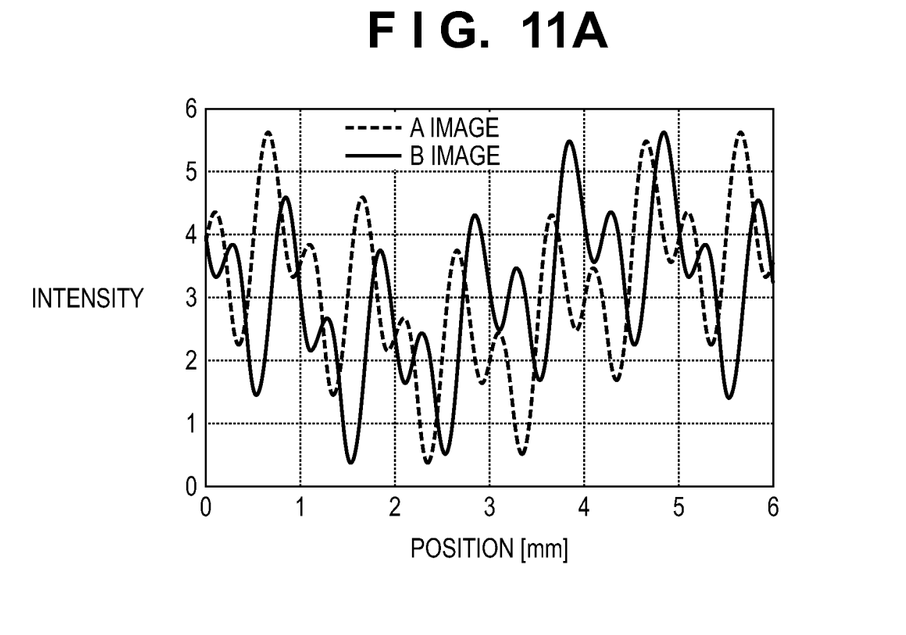
FIGS. 11A and 11B are graphs for explaining a phase information calculation processing method when another object is captured according to the embodiment.

An example of capturing an object different from one shown in FIG. 8A will be explained with reference to FIGS. 11A and 11B. FIG. 11A shows a pair of focus detection images (A and B images) of the object sensed by the image sensor 300. In FIG. 11A, the abscissa represents a position on the image sensor 300. The image shift amount between the two focus detection images is 0.8 mm.

Figure 11B:
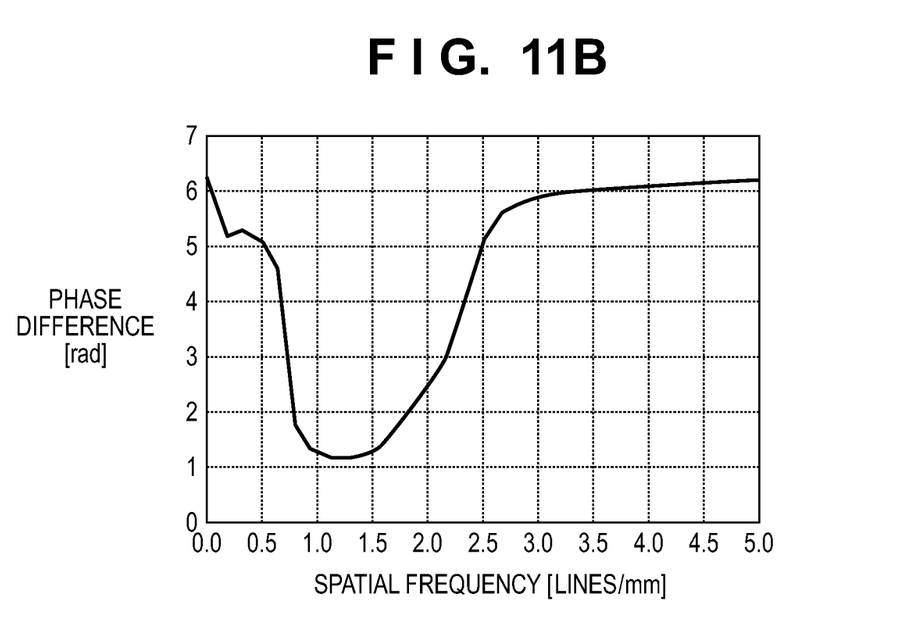

FIG. 11B shows the spatial frequency characteristic of the phase difference between the two focus detection images obtained by the CPU 150 after fast Fourier transform by the calculation circuit 154. The CPU 150 obtains a spatial frequency ($\approx$1.25 lines/mm) at which the phase difference is minimized (or comes closest to $2\pi$). Then, the CPU 150 sets the reciprocal of the spatial frequency as the image shift amount ($=\frac{1}{1.25}$mm) between the two focus detection images. Further, the CPU 150 calculates the defocus amount of the imaging lens 200 from the base line length and the calculated image shift amount.

Note that pieces of phase information of two focus detection images obtained by fast Fourier transform are obtained from discrete spatial frequencies. It is therefore effective to obtain the phase information by performing interpolation processing near the spatial frequency at which the phase difference is minimized (or comes closest to $2\pi$).

As described above, according to the embodiment, high-accuracy focus detection independent of the spatial frequency of an object can be performed.

By performing focus detection processing corresponding to vignetting, an image can be corrected in accordance with the vignetting state of a beam for focus detection, improving the in-focus accuracy.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-255509, filed on Nov. 21, 2012 which is hereby incorporated by reference herein in its entirety.

What is claimed is:

1. A focus detection apparatus comprising:
   an image sensor comprising a plurality of pixels configured to receive a plurality of beams having passed through different exit pupil regions of an imaging optical system and output a pair of image signals corresponding to the different exit pupil regions;
   a calculation circuit configured to obtain, from a fast Fourier transform of the pair of image signals, a spatial frequency at which a phase difference between a pair of images is minimized, and obtain an image shift amount between the pair of image signals from the spatial frequency; and
   a focus lens driving unit configured to perform focus control by a phase difference detection method based on the image shift amount obtained by said calculation unit.

2. The apparatus according to claim 1, further comprising an acquisition unit configured to acquire optical information of the imaging optical system,
   wherein said calculation circuit calculates vignetting of the exit pupil region based on the optical information, corrects asymmetry between the pair of image signals based on the vignetting, and obtains the spatial frequency by using the pair of corrected image signals.

3. The apparatus according to claim 2, wherein in a case where a control amount of an imaging lens forming the imaging optical system controlled in the focus control falls outside a predetermined range, said calculation circuit obtains the spatial frequency by using the pair of image signals for which asymmetry based on the vignetting is corrected.

4. An image capturing apparatus comprising a focus detection apparatus defined in claim 1.

5. A focus detection method comprising:
   receiving a plurality of beams having passed through different exit pupil regions of an imaging optical system and outputting a pair of image signals corresponding to the different exit pupil regions;
   obtaining, from a fast Fourier transform of the pair of image signals, a spatial frequency at which a phase difference between a pair of images is minimized, and obtaining an image shift amount between the pair of image signals from the spatial frequency; and
   performing focus control by a phase difference detection method based on the image shift amount obtained.

6. The method according to claim 5, further comprising:
   acquiring optical information of the imaging optical system;
   calculating vignetting of the exit pupil region based on the optical information, and correcting asymmetry between the pair of image signals based on the vignetting; and
   obtaining the spatial frequency by using the pair of corrected image signals, and obtaining an image shift amount between the pair of image signals from the spatial frequency.

7. The method according to claim 6, wherein in a case where a control amount of an imaging lens forming the imaging optical system controlled in the focus control falls outside a predetermined range, the calculating step and the obtaining step are executed.

\* \* \* \* \*